(12) United States Patent
Kim et al.

(10) Patent No.: US 12,492,291 B2
(45) Date of Patent: Dec. 9, 2025

(54) WINDOW LAMINATE AND METHOD FOR MANUFACTURING THE SAME (71) Applicant: DONGWOO FINE-CHEM CO., LTD., Iksan-si (KR)

(72) Inventors: Duckkyeom Kim, Hwaseong-si (KR); Beomcheol Kim, Pyeongtaek-si (KR); Jeongmin Choi, Suwon-si (KR); Hee Yong Lee, Asan-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 15 days.

(21) Appl. No.: 18/269,723

(22) PCT Filed: Dec. 21, 2021

(86) PCT No.: PCT/KR2021/019474
§ 371 (c)(1),
(2) Date: Jun. 26, 2023

(87) PCT Pub. No.: WO2022/145851
PCT Pub. Date: Jul. 7, 2022

(65) Prior Publication Data
US 2024/0059852 A1 Feb. 22, 2024

(30) Foreign Application Priority Data
Dec. 28, 2020 (KR) .................. 10-2020-0184562

(51) Int. Cl.
*C08J 7/046* (2020.01)
*C08J 7/04* (2020.01)
*C08J 7/12* (2006.01)

(52) U.S. Cl.
CPC .............. *C08J 7/046* (2020.01); *C08J 7/042* (2013.01); *C08J 7/123* (2013.01)

(58) Field of Classification Search
CPC . C08J 7/046; C08J 7/042; C08J 7/123; B05D 3/007; B05D 3/12; C23C 18/143
See application file for complete search history.

(56) References Cited

U.S. PATENT DOCUMENTS

2013/0146860 A1\* 6/2013 Toyama ............... H10K 77/111
427/520
2016/0223722 A1\* 8/2016 Ahn ........................ G02B 1/14
(Continued)

FOREIGN PATENT DOCUMENTS

KR 10-2014-0136996 A 12/2014
KR 10-2015-0069414 A 6/2015
(Continued)

OTHER PUBLICATIONS

International Search Report for PCT/KR2021/019474 dated Apr. 12, 2022 [PCT/ISA/210].
(Continued)

*Primary Examiner* — Michael P Wieczorek
(74) *Attorney, Agent, or Firm* — Sughrue Mion, PLLC (57) ABSTRACT

A window laminate includes a base layer and a functional layer formed on the base layer, in which at least one side end of the functional layer forms an identical line with a corresponding side end of the base layer. The identical line of the side ends of the base layer and the functional layer forms a cut vertical plane.

12 Claims, 5 Drawing Sheets

(56) References Cited

U.S. PATENT DOCUMENTS

2019/0288092 A1* 9/2019 Katayama ......... H01L 29/78633
2019/0363206 A1* 11/2019 Fukuda ........... H01L 31/022425

FOREIGN PATENT DOCUMENTS

| KR | 10-2016-0095708 A | 8/2016 |
| KR | 10-1744563 B1 | 6/2017 |
| KR | 10-2017-0110241 A | 10/2017 |
| KR | 10-2020-0016198 A | 2/2020 |
| KR | 10-2020-0115091 A | 10/2020 |

OTHER PUBLICATIONS

Communication issued Apr. 2, 2025 in Korean Patent Application No. 10-2020-0184562.

* cited by examiner

WINDOW LAMINATE AND METHOD FOR MANUFACTURING THE SAME

CROSS REFERENCE TO RELATED APPLICATIONS

This application is a National Stage of International Application No. PCT/KR2021/019474 filed Dec. 21, 2021, claiming priority based on Korean Patent Application No. 10-2020-0184562 filed Dec. 28, 2020.

TECHNICAL FIELD

The present invention relates to a window laminate. Particularly, the present invention relates to a window laminate having uniform flatness and reduced assembly tolerance, and a method for manufacturing the window laminate.

BACKGROUND ART

Image display devices are rapidly becoming flexible in recent years, in addition to thinning. Flexibility of these display devices requires flexible displays that can be bent, flexed, or rolled without loss of properties.

Flexible displays require flexible window laminates. Flexible window laminates are made of ultra-thin glasses, flexible plastics, and the like. Glass materials have limitations in terms of flexibility and impact resistance, so flexible plastics are being actively researched. On the other hand, flexible plastics are advantageous in terms of flexibility, but repeated folding and bending may cause stress to accumulate, resulting in breakage and damage to the window laminate. In addition, flexible plastics may be weaker in terms of surface strength such as scratch resistance compared to glass materials. To address these problems, conventional window laminates have a number of functional layers added to the base layer.

Figure 1:
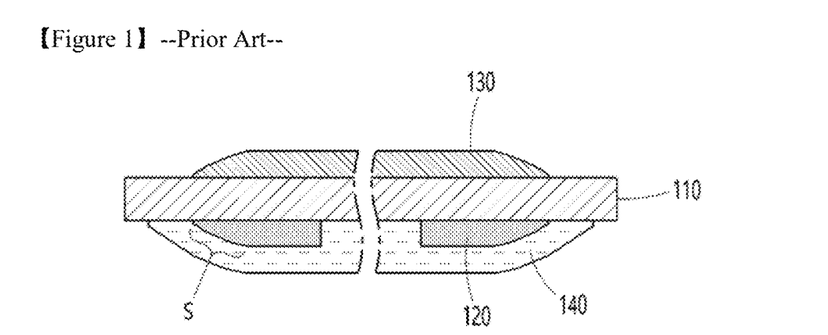
FIG. 1 is a cross-sectional view illustrating an example of a window laminate according to the prior art.

FIG. 1 is a cross-sectional view illustrating an example of a window laminate according to the prior art.

As shown in FIG. 1, a conventional window laminate may include a base layer 110, a decorative layer 120, a hard coating layer 130, a planarization layer 140, and the like.

The base layer 110 is a substrate of the window laminate, and made of glass, plastic, or the like.

The decorative layer 120 and the hard coating layer 130 are functional layers. The decorative layer 120 performs the function of blocking light. The hard coating layer 130 is made of a transparent material and performs functions such as preventing scratches, blocking external moisture, absorbing shocks, and preventing fingerprints. The planarization layer 140 is coupled to the decorative layer 120 to perform functions such as planarization and protection.

However, in the prior art, the decorative layer 120, the hard coating layer 130, and the like are formed by a printing process, photolithography process, or the like. In this case, an inclined portion S is formed at the edge of the decorative layer 120, the hard coating layer 130, etc., and the flatness of the decorative layer 120, the hard coating layer 130, etc. is reduced. In addition, the side end step caused by the inclined portion S causes a tolerance at the side joint when laterally coupled with other parts, which causes a decrease in the quality of the product.

DISCLOSURE OF INVENTION

Technical Problem

An object of the present invention is to uniformize the flatness of functional layers such as a decorative layer and a hard coating layers laminated to a base layer in a window laminate.

Another object of the present invention is to prevent or minimize the occurrence of tolerances in a window laminate when assembled with other parts.

Technical Solution

A window laminate of the present invention to achieve such objects may include a base layer and a functional layer.

The functional layer is formed on the base layer, and at least one side end of the functional layer may form an identical line with a corresponding side end of the base layer.

In the window laminate of the present invention, the identical line of the side ends of the base layer and the functional layer may be a cut vertical plane.

In the window laminate of the present invention, the base layer may be a window film, and the functional layer may be a decorative layer or a hard coating layer.

In the window laminate of the present invention, the base layer is a window film. The functional layer may include a first functional layer coupled to one surface of the base layer and a second functional layer coupled to the other surface of the base layer. Here, the first functional layer may be a decorative layer, and the second functional layer may be a hard coating layer.

The window laminate of the present invention may further include a third functional layer coupled to the first functional layer. At least one side end of the third functional layer may be a cut vertical plane forming an identical line with corresponding side ends of the base layer and the first and second functional layers.

In the window laminate of the present invention, the third functional layer may be an overcoat layer.

A window laminate manufacturing method according to the present invention may include forming a functional layer larger than a target size on a base layer larger than the target size, and cutting at least one edges of the base layer and the functional layer vertically to form the target size.

In the window laminate manufacturing method of the present invention, the forming the functional layer may form the functional layer by a printing process or a photo process to form an inclined portion on at least one edge. In this case, the cutting may cut inward from the inclined portion.

In the window laminate manufacturing method of the present invention, the printing process may use inkjet printing with photocurable type ink.

In the window laminate manufacturing method of the present invention, the cutting may use laser or pinnacle.

The window laminate manufacturing method of the present invention may further include determining whether to perform the cutting.

In the window laminate manufacturing method of the present invention, the determining may include determining whether a laminate of the base layer and the functional layer is to be laterally coupled.

Advantageous Effects

When forming a functional layer on a window laminate by a printing process or a photo process, the present invention can eliminate inclined portions that may occur on the edges of the functional layer, thereby making the functional layer uniform throughout.

By cutting the side ends of the window laminate to form a vertical plane, the present invention can facilitate coupling when laterally joining with other parts and eliminate steps, thereby eliminating or minimizing the occurrence of tolerances.

BEST MODE

Hereinafter, the present invention will be described in more detail with reference to the accompanying drawings.

Figure 2A:
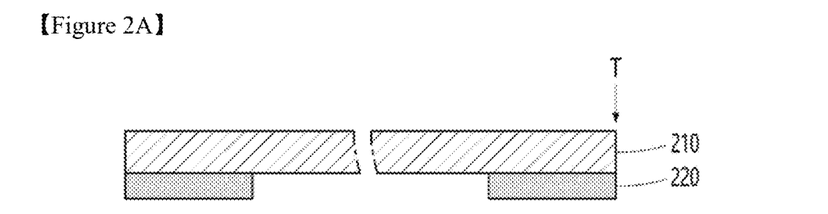
FIGS. 2A to 2C are cross-sectional views of window laminates of the first to third embodiments according to the present invention, respectively.
Figure 2B:
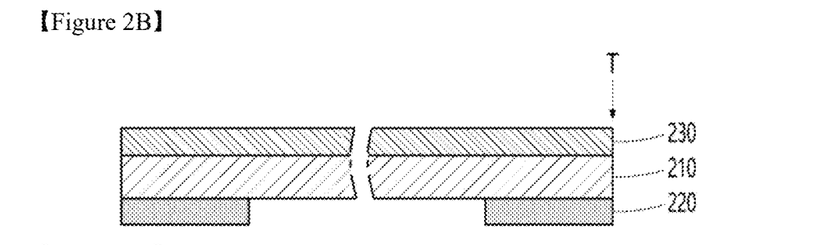
Figure 2C:
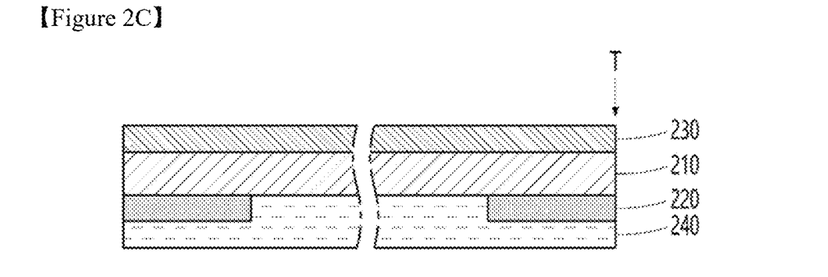

FIGS. 2A to 2C are cross-sectional views of window laminates of the first to third embodiments according to the present invention, respectively.

As shown in FIG. 2A, a window laminate of the first embodiment may include a base layer 210, a first functional layer 220, and so on.

The base layer 210 is a substrate for the window laminate, which may be, for example, a window film made of a transparent material.

As the window film, transparent polymers applicable to flexible displays, for example, triacetyl cellulose, acetyl cellulose butyrate, ethylene-vinyl acetate copolymer, propionyl cellulose, butyryl cellulose, acetyl propionyl cellulose, polyester, polystyrene, polyamide, polyetherimide, polyacryl, polyimide, polyethersulfone, polysulfone, polyethylene, polypropylene, polymethylpentene, polyvinyl chloride, polyvinylidene chloride, polyvinyl alcohol, polyvinyl acetal, polyether ketone, polyether ether ketone, polyether sulfone, polymethyl methacrylate, polyethylene terephthalate, polybutylene terephthalate, polyethylene naphthalate, polycarbonate may be used individually or in a mixture of two or more thereof.

The first functional layer 220 is coupled to one surface of the base layer 210 to perform a specific function, and may be a decorative layer, for example.

The decorative layer may be patterned on one surface of the base layer 210 to function as a light shielding layer to block light. The decorative layer may be located on a non-display area of the display device, such as a bezel area surrounding the display area.

The decorative layer may be composed of a black resin composition. As the black resin composition, a composition including a resin with black pigment particles dispersed, a binder resin, a polymerizable compound, a polymerization initiator, and an additive, or a photocurable (or thermosetting) resin composition including a black pigment to exhibit black color may be used. The decorative layer may use a selectively patternable composition having an optical density of 38 or more per 1 μm.

The black pigment may be carbon black, graphite, metal oxide, or the like. The black pigment may include an organic black pigment. The organic black pigment may be aniline black, lactam black, or perylene black series.

The additive may include an adhesion promoter, a photocrosslinking sensitizer, a curing accelerator, a surfactant, a dispersant, an antioxidant, an ultraviolet absorber, a thermal polymerization inhibitor, a leveling agent, and the like, and may include one or more of these.

The first functional layer 220 may have at least one side end forming an identical line with a corresponding side end of the base layer 210. Here, the identical line may be a cut vertical plane T that is formed by cutting with the base layer 210. By doing so, any inclined portions of the first functional layer 220 that may be formed at the edges when the first functional layer 220 is formed on the base layer 210 may be eliminated. As a result, the thickness of the first functional layer 220 may become uniform over the entire surface, and furthermore, in the case of lateral coupling with other components, assembly tolerances may be eliminated or minimized by preventing a joint step or the like that may occur due to the inclined portion.

As shown in FIG. 2B, a window laminate of the second embodiment may include a base layer 210, a first functional layer 220, a second functional layer 230, and so on.

Since the base layer 210 and first functional layer 220 of the second embodiment are identical to the corresponding configurations of the first embodiment, a detailed description thereof will be replaced to the relevant description of the first embodiment described above.

The second functional layer 230 may be couple to the other surface of the base layer 210, i.e., the opposite surface of the first functional layer 220.

The second functional layer 230 may be, for example, a hard coating layer that protects the base layer 210 from scratches, external moisture, and the like.

The hard coating layer may include a photopolymerization compound, a photoinitiator, a solvent, and the like.

The photopolymerization compound may be a component that is photocured to provide a matrix of the hard coating layer. For example, the photopolymerization compound can be a (meth)acrylate-based oligomer or a (meth)acrylate-based monomer. The (meth)acrylate-based oligomers can be, for example, epoxy (meth)acrylates, urethane (meth)acrylate-based compounds, and the like, preferably urethane (meth)acrylate-based compounds in view of the elastic and flexural properties of the hard coating layer. As for the (meth)acrylate-based monomer, for example, a (meth)acryloyl group may be used as a photocurable group.

A photoinitiator is included to induce photocuring of the hard coating layer, and, for example, a photo-radical initiator capable of forming radicals by light irradiation may be used.

Solvents may be used without particular limitation, for example, alcohols (methanol, ethanol, isopropanol, butanol, methyl cellosolve, ethyl cellosolve, etc.), ketones (methylethyl ketone, methylbutyl ketone, methylisobutyl ketone, diethyl ketone, dipropyl ketone, cyclohexanone, etc.), and the like may be used.

The second functional layer 230 may have at least one side end forming an identical line with a corresponding side end of the base layer 210 and the first functional layer 220. Here, the identical line may be a cut vertical plane T formed by cutting with the base layer 210 and the first functional layer 220. By doing so, any inclined portions of the first and second functional layers 220 and 230 that may be formed at the edges when the first and second functional layers 220 and 230 are formed on the base layer 210 may be eliminated. As a result, the thickness of the first and second functional layers 220, 230 may become uniform over the entire surface, and furthermore, assembly tolerances such as a joint step that may be caused by the inclined portion may be eliminated or minimized even when laterally coupling with other parts.

In the second embodiment of FIG. 2B, the window laminate may include only the second functional layer 230 without the first functional layer 220. That is, it may be composed of the base layer 210 and the second functional layer 230, and may be configured to cut at least one side ends of the base layer 210 and the second functional layer 230 together so that the side ends have a cut vertical plane T forming the identical line.

As shown in FIG. 2C, a window laminate of the third embodiment may include a base layer 210, a first functional layer 220, a second functional layer 230, a third functional layer 240, and so on.

The base layer 210, first functional layer 220, and second functional layer 230 of the third embodiment are identical to the corresponding configurations of the first and second embodiments, and therefore, detailed descriptions thereof will be replaced with the relevant descriptions of the first and second embodiments described above.

The third functional layer 240 is coupled to the first functional layer 220, and may be an overcoat layer that performs functions such as planarization, shock absorption, and the like.

The overcoat layer may perform functions such as surface step correction, planarization, refractive index control, protection, etc. of the decorative layer.

The overcoat layer may be formed of an organic film, or may be formed of an inorganic film or an organic-inorganic hybrid film. As the organic layer, polyacrylate, polyimide, polyester, or the like may be used. As the inorganic film, silazane, silica, or an inorganic film or metal film having light transmittance guaranteed may be used. The inorganic film may contain inorganic fillers. The inorganic filler may be spherical nanoparticles capable of improving light extraction efficiency. The organic-inorganic hybrid film may use a dispersed organic-inorganic hybrid composite such as siloxane or silsesquioxane.

The overcoat layer may be replaced with an adhesive layer or a tacky layer, and a pressure sensitive adhesive (PSA) composition or an optically clear adhesive (OCA) composition may be used, for example.

The third functional layer 240 may have at least one side end forming an identical line with a corresponding side end of the base layer 210 and the first and second functional layers 220 and 230. Here, the identical line may be a cut vertical plane T that is formed by cutting with the base layer 210 and the first and second functional layers 220 and 230. By doing so, any inclined portions of the first to third functional layers 220, 230, and 240 that may be formed at the edges when the first to third functional layers 220, 230, and 240 are formed on the base layer 210 may be eliminated. As a result, the thickness of the first to third functional layers 220, 230, and 240 may become uniform over the entire surface, and furthermore, assembly tolerances such as a joint step that may occur due to the inclined part may be eliminated or minimized even when laterally coupling with other parts.

Figure 3A:
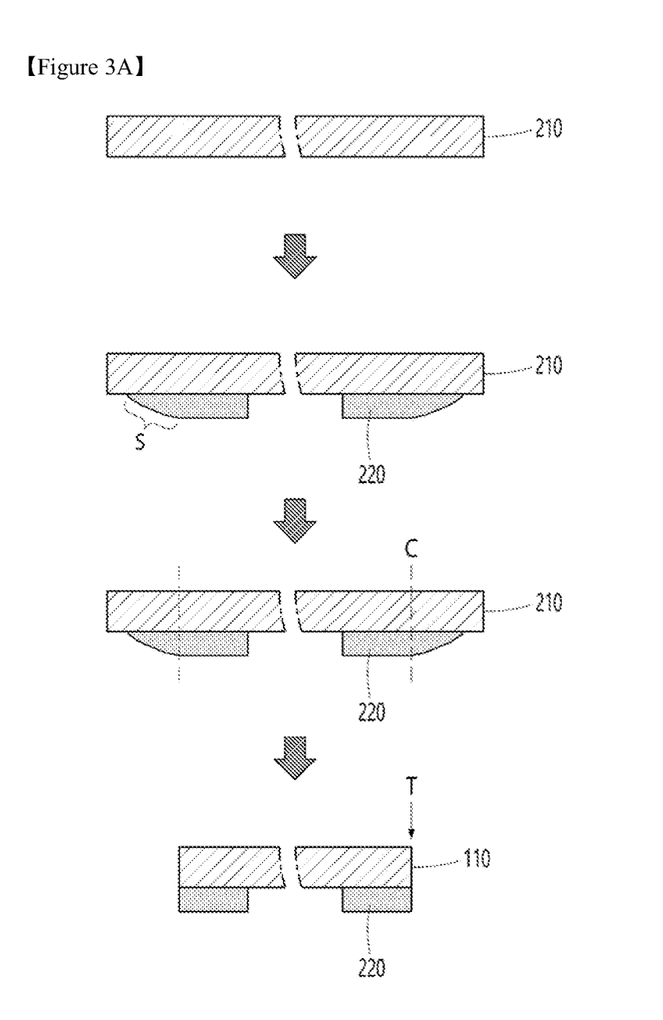
FIGS. 3A to 3C are process diagrams illustrating methods for manufacturing window laminates of the first to third embodiments according to the present invention, respectively.
Figure 3B:
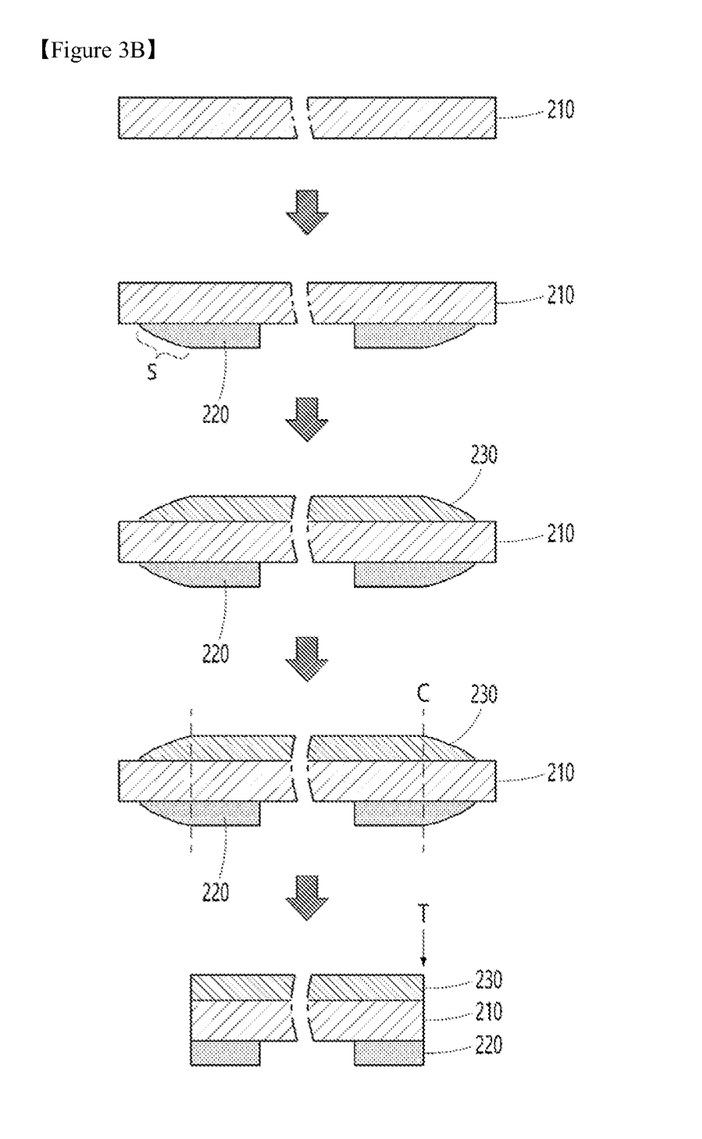
Figure 3C:
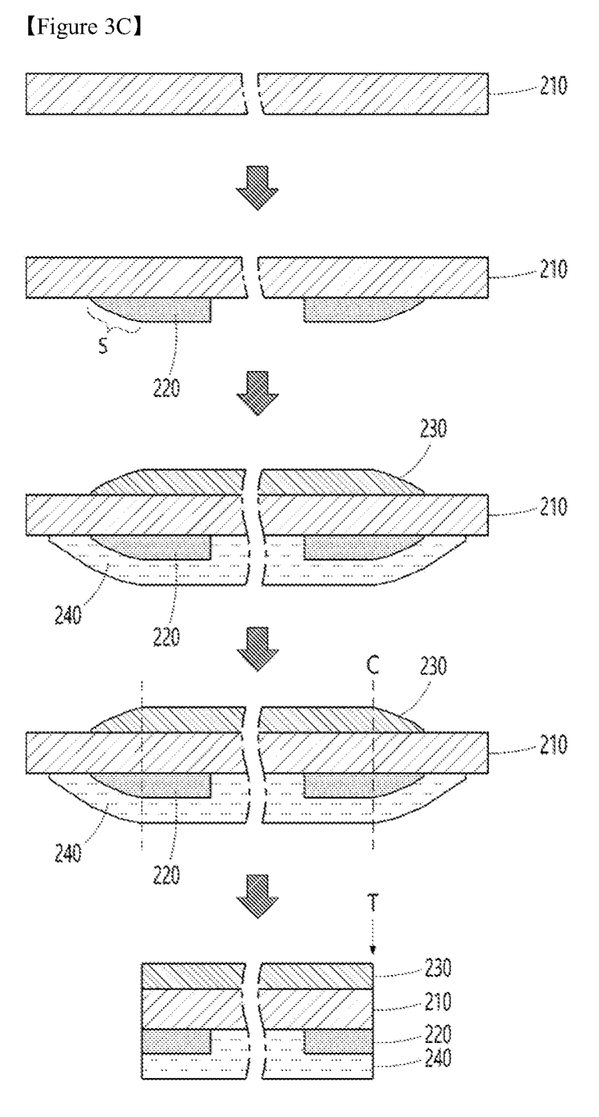

FIGS. 3A to 3C are process diagrams illustrating methods for manufacturing window laminates of the first to third embodiments according to the present invention, respectively.

FIG. 3A illustrates a method for manufacturing a window laminate of the first embodiment.

In the first step, a base layer 210 that is larger than a target size may be prepared. The base layer 210 is a substrate for the window laminate, and may be a polymeric film of a transparent material, for example.

In the second step, a first functional layer 220 larger than the target size may be formed on the base layer 210. The first functional layer 220 may be a decorative layer. The decorative layer may be formed on a non-display area of a display device, that is, a bezel area surrounding the display area. The decorative layer may be composed of a black resin composition.

In the second step, the black resin composition may be coated by a printing process such as inkjet printing or by doctor blade coating, squeeze coating, spray coating, spin coating, gravure coating, roll coating, or the like, or may be formed by photolithography process with a photosensitive black resin composition. In this case, the first functional layer 220 may have an inclined portion S, that decreases in thickness toward the end, in an edge region.

In the third step, the base layer 210 and the first functional layer 220 are simultaneously cut along a cutting line C with the inclined portion S as the outer region, so that the base layer 210 and the first functional layer 220 may be formed to have the target size. The cutting may use a method such as pinnacle cutting, laser cutting, or the like.

In the fourth step, a window laminate of the first embodiment having a portion of the edge cut, that is, a cut vertical plane T formed at the side end, may be created.

FIG. 3B illustrates a method for manufacturing a window laminate of the second embodiment, in which, a base layer 210 larger than a target size may be prepared in the first step, and a first functional layer 220 larger than the target size may be formed on one surface of the base layer 210 in the second step, as shown in FIG. 3A.

In the third step, a second functional layer 230 may be formed on the other surface of the base layer 210. The second functional layer 230 may be a hard coating layer. The hard coating layer may be formed using roll-to-roll gravure coating, doctor blade coating, squeeze coating, inkjet printing, die coater, reverse roll, spraying, or the like. When inkjet printing is used, the ink may preferably be a photocurable type ink that is easy to apply to the film form.

In edge regions of the first functional layer 220 and the second functional layer 230 formed in the second and third steps, an inclined portion S that decreases in thickness toward the end may be formed.

In the fourth step, the base layer 210 and the first and second functional layers 220 and 230 may be cut simultaneously along a cutting line C with the inclined portion S as the outer region, so that the base layer 210 and the first and second functional layers 220 and 230 may be formed to have the target size. The cutting may use a method such as pinnacle cutting, laser cutting, and the like.

In the fifth step, a portion of the edge may be cut to make a window laminate of the second embodiment having a cut vertical plane T at the side end.

FIG. 3C illustrates a method for manufacturing a window laminate of the third embodiment, in which a base layer 210 larger than a target size is prepared in the first step, as shown in FIG. 3B. In the second step, a first functional layer 220 larger than the target size is formed on one surface of the base layer 210, and in the third step, a second functional layer 230 is formed on the other surface of the base layer 210.

In the fourth step, a third functional layer 240 is formed on the first functional layer 220. The third functional layer 240 may be an overcoat layer. The overcoat layer may be formed of an adhesive composition containing an acrylic copolymer and a crosslinker or an adhesive composition containing a urethane (meth)acrylate resin, a (meth)acrylate ester monomer, and a photoinitiator using a die coater, reverse roll, spray, blade, gravure, or the like. The overcoat layer may also be a pressure sensitive adhesive (PSA) composition or an optically clear adhesive (OCA) composition.

The first to third functional layers 220, 230, and 240 formed in the second to fourth steps, respectively, may have an inclined portion S that decreases in thickness toward an end in an edge region.

In the fifth step, the base layer 210 and the first to third functional layers 220, 230, and 240 may be cut simultaneously along a cutting line C with the inclined portion S as the outer region, so that the base layer 210 and the first to third functional layers 220, 230, and 240 may be formed to have the target size. The cutting may use a method such as pinnacle cutting, laser cutting, or the like.

In the sixth step, a portion of the edge may be cut to make a window laminate of the third embodiment having a cut vertical plane T at the side end.

The manufacturing methods of FIGS. 3A to 3C may further include a step of determining whether to perform the step of cutting the base layer 210 and the functional layer coupled thereto. The step of determining whether to cut may be a step of determining whether the laminate of the base layer 210 and the functional layers 220 to 240 is to be laterally coupled with other components.

Figure 4:
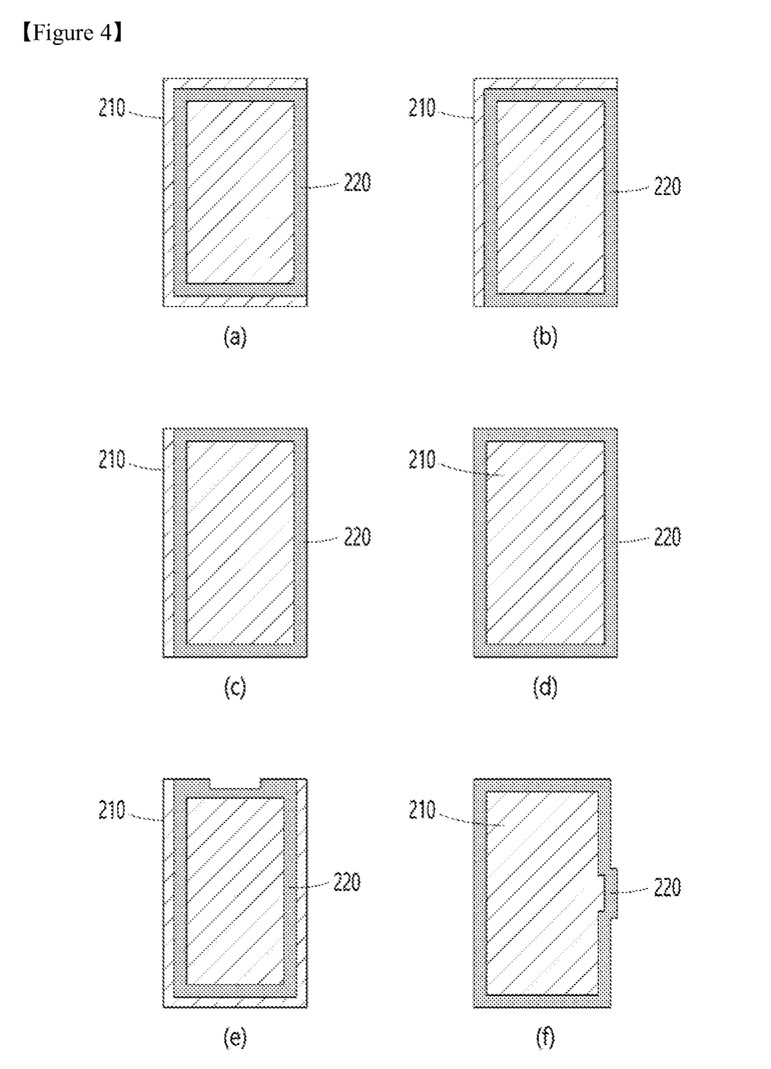
FIG. 4 is a plan view illustrating various applications of a window laminate according to the present invention.

FIG. 4 is a plan view illustrating various applications of a window laminate according to the present invention.

First, as shown in (a) to (d) of FIG. 4, cut vertical planes T of base layers 210 and functional layers 220 may be selectively formed on one side, two sides, three sides, or all four sides of the plurality of sides as needed.

Further, as shown in (e) and (f) of FIG. 4, the cut vertical surface T of the base layer 210 and the functional layer 220 may include depressed (notched) regions, protruding regions, and the like.

The window laminates described above may be applied to a variety of display panels. Display panels may include plasma display panels (PDPs), light emitting diode panels (LEDs), organic light emitting diode panels (OLEDs), liquid crystal display panels (LCDs), thin film transistor liquid crystal display panels (LCD-TFTs), and the like.

Although particular embodiments of the present invention have been shown and described, it will be understood by those skilled in the art that it is not intended to limit the present invention to the preferred embodiments, and it will be obvious to those skilled in the art that various changes and modifications may be made without departing from the spirit and scope of the invention. The scope of the present invention, therefore, is to be defined by the appended claims and equivalents thereof.

| [Description of reference numerals] | |
|---|---|
| 110, 210: base layer | 120, 220: first functional layer |
| 130, 230: second functional layer | 140, 240: third functional layer |
| C: cut line | S: inclined portion |
| T: cut vertical plane | |

The invention claimed is:

1. A window laminate manufacturing method comprising:
   forming a functional layer that is larger than a target size and has an inclined portion at an edge on a base layer, said base layer being larger than the target size and having a planar upper surface, wherein the inclined portion of the functional layer is located on the planar upper surface of the base layer; and
   cutting through at least one edge of a laminate consisting of the base layer and the functional layer vertically along a thickness direction of the laminate inward from the inclined portion of the functional layer to form the target size.

2. The window laminate manufacturing method of claim 1, wherein:
   the forming the functional layer forms the functional layer by a printing process or photolithography process.

3. The window laminate manufacturing method of claim 2, wherein the printing process uses inkjet printing with photocurable type ink.

4. The window laminate manufacturing method of claim 3, further comprising determining whether to perform the cutting.

5. The window laminate manufacturing method of claim 4, wherein the determining determines whether a laminate of the base layer and the functional layer is to be laterally coupled.

6. The window laminate manufacturing method of claim 2, wherein the cutting uses laser or pinnacle.

7. The window laminate manufacturing method of claim 6, further comprising determining whether to perform the cutting.

8. The window laminate manufacturing method of claim 7, wherein the determining determines whether a laminate of the base layer and the functional layer is to be laterally coupled.

9. The window laminate manufacturing method of claim 2, further comprising determining whether to perform the cutting.

10. The window laminate manufacturing method of claim 9, wherein the determining determines whether a laminate of the base layer and the functional layer is to be laterally coupled.

11. The window laminate manufacturing method of claim 1, further comprising determining whether to perform the cutting.

12. The window laminate manufacturing method of claim 11, wherein the determining determines whether a laminate of the base layer and the functional layer is to be laterally coupled.

* * * * *